(12) United States Patent
Aikawa

(10) Patent No.: US 6,353,351 B1
(45) Date of Patent: Mar. 5, 2002

(54) CLOCK GENERATOR CIRCUIT

(75) Inventor: Minoru Aikawa, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/855,512

(22) Filed: May 16, 2001

(30) Foreign Application Priority Data

Dec. 28, 2000 (JP) ............................................. 12-400516

(51) Int. Cl.[7] .................................................. G06F 1/04
(52) U.S. Cl. ..................... 327/291; 327/298; 327/299; 327/114; 327/144
(58) Field of Search ................................ 327/298, 299, 327/114, 144, 291

(56) References Cited

U.S. PATENT DOCUMENTS 6,194,940 B1 * 2/2001 Hunter et al. ................ 327/298

FOREIGN PATENT DOCUMENTS

JP          11-186899          7/1999

* cited by examiner

*Primary Examiner*—Margaret R. Wambach
(74) *Attorney, Agent, or Firm*—Leydig, Voit, & Mayer, Ltd.

(57) ABSTRACT

A clock generator circuit includes an oscillation circuit which generates a first clock signal, a first timer which counts the first clock signal, a ring oscillator which generates a second clock signal, a second timer which counts the second clock signal, and a third timer that generates a third clock signal which is the output clock signal.

8 Claims, 8 Drawing Sheets

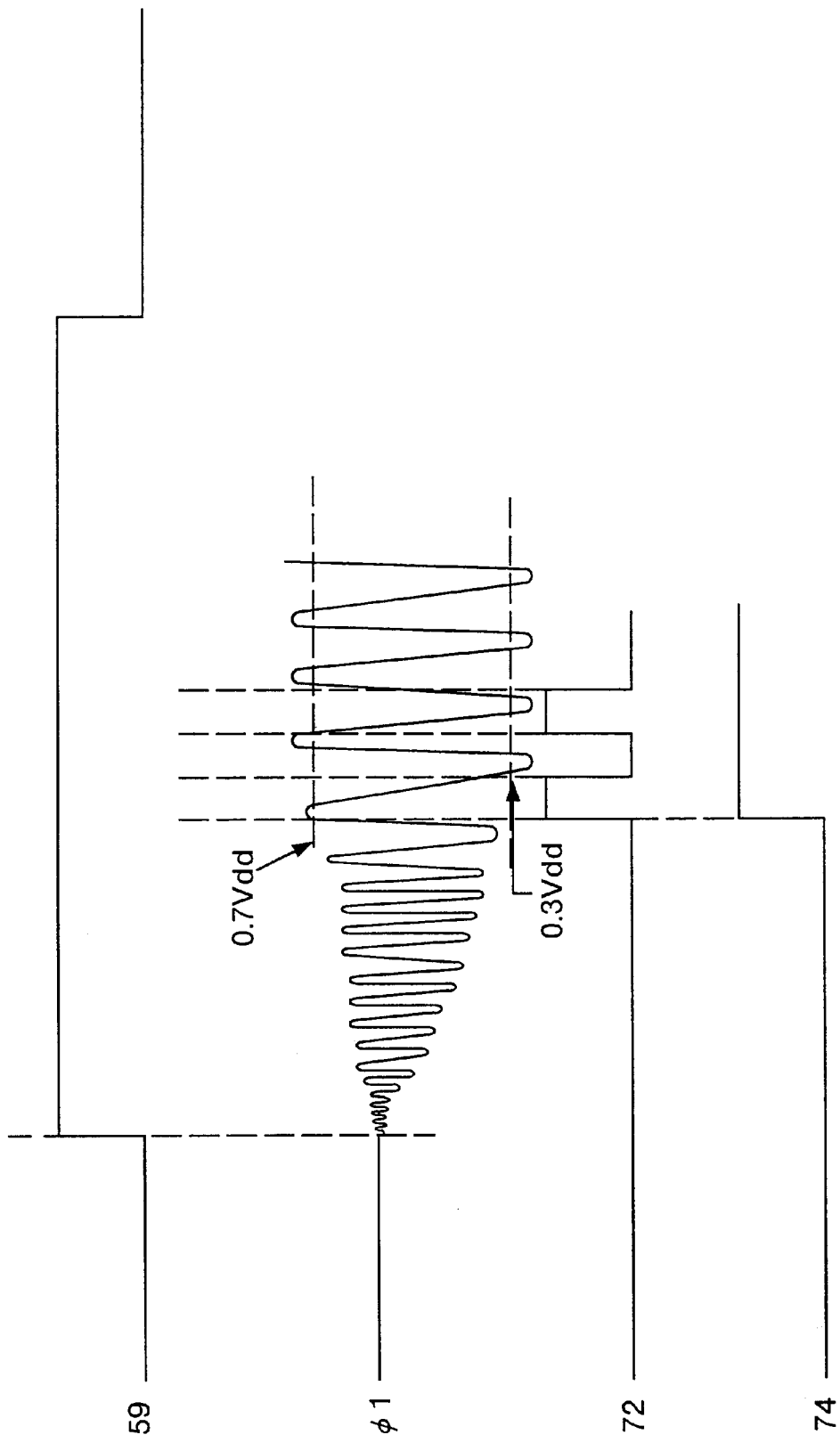

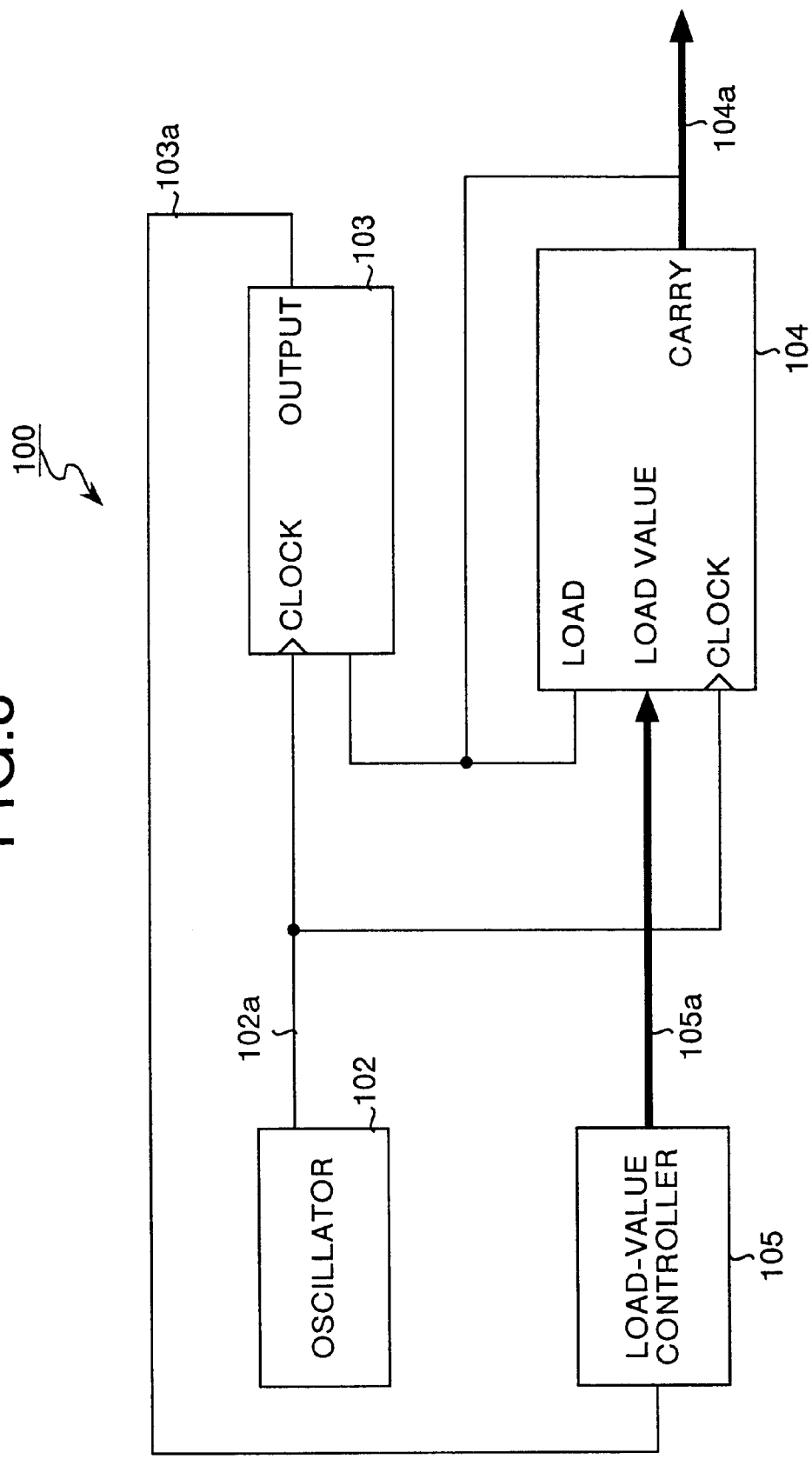

CLOCK GENERATOR CIRCUIT

FIELD OF THE INVENTION

The present invention in general relates to a clock generator circuit. More particularly, this invention relates to a clock generator circuit used in semiconductor devices and that has a high precision correction of frequency with low power consumption.

BACKGROUND OF THE INVENTION

A conventional clock generator circuit disclosed in Japanese Patent Application Laid-Open No. 11-186899 is shown in FIG. 8. This clock generator circuit 100 comprises an oscillator 102, a load-value change-timing generator 103, a variable counter 104, and a load-value controller 105.

The oscillator 102 generates an original oscillation clock 102a, and outputs this clock to the load-value change-timing generator 103 and the variable counter 104.

The load-value change timing generator 103 counts in synchronism with the original oscillation clock 102a input from the oscillator 102 to a clock input terminal. Then, based on the count value, the load-value change timing generator 103 makes a decision to be supplied to the variable counter 104 concerning a load value, and outputs a result of this decision to the load-value controller 105 as a load-value change timing 103a.

The variable counter 104 counts in synchronism with the original oscillation clock 102a input from the oscillator 102 to a clock input terminal. When the counting reaches a predetermined count value, the variable counter 104 outputs a carry signal 104a.

According to this conventional clock generator circuit, when the period of the oscillator has varied due to a change in the operation environment such as, for example, a change in temperature, or a change in voltage, the output period of the carry signal 104a also varies. As a result, it becomes difficult to obtain the necessary period.

Further, as the correction precision of the frequency is determined based on the frequency of the oscillator, it is impossible to carry out a fine adjustment.

Further, as the oscillator is always operating, this has a problem of wasteful power consumption.

SUMMARY OF THE INVENTION

The clock generator circuit of this invention comprises an oscillation circuit which generates a first clock signal, a first timer which counts the first clock signal, and a ring oscillator which generates a second clock signal. Furthermore, there is provided a second timer that is input with an overflow signal of the first timer, and that counts the second clock signal. Furthermore, there is provided a third timer that has a reload register for storing an inverted value of each bit of the second timer, and that generates a third clock signal. This third timer counts the inverted value, and sets the count value in the reload register.

Other objects and features of this invention will become apparent from the following description with reference to the accompanying drawings.

BRIEF DESCRIPTION OF THE DRAWINGS

FIG. 7 is a timing chart of the clock generator circuit according to the third embodiment of the present invention; and FIG. 8 is a block diagram of a conventional clock generator circuit.

DESCRIPTION OF THE PREFERRED EMBODIMENTS

Preferred embodiments of the clock generator circuit in accordance with the present invention will be explained below with reference to the accompanying drawings.

Figure 1:
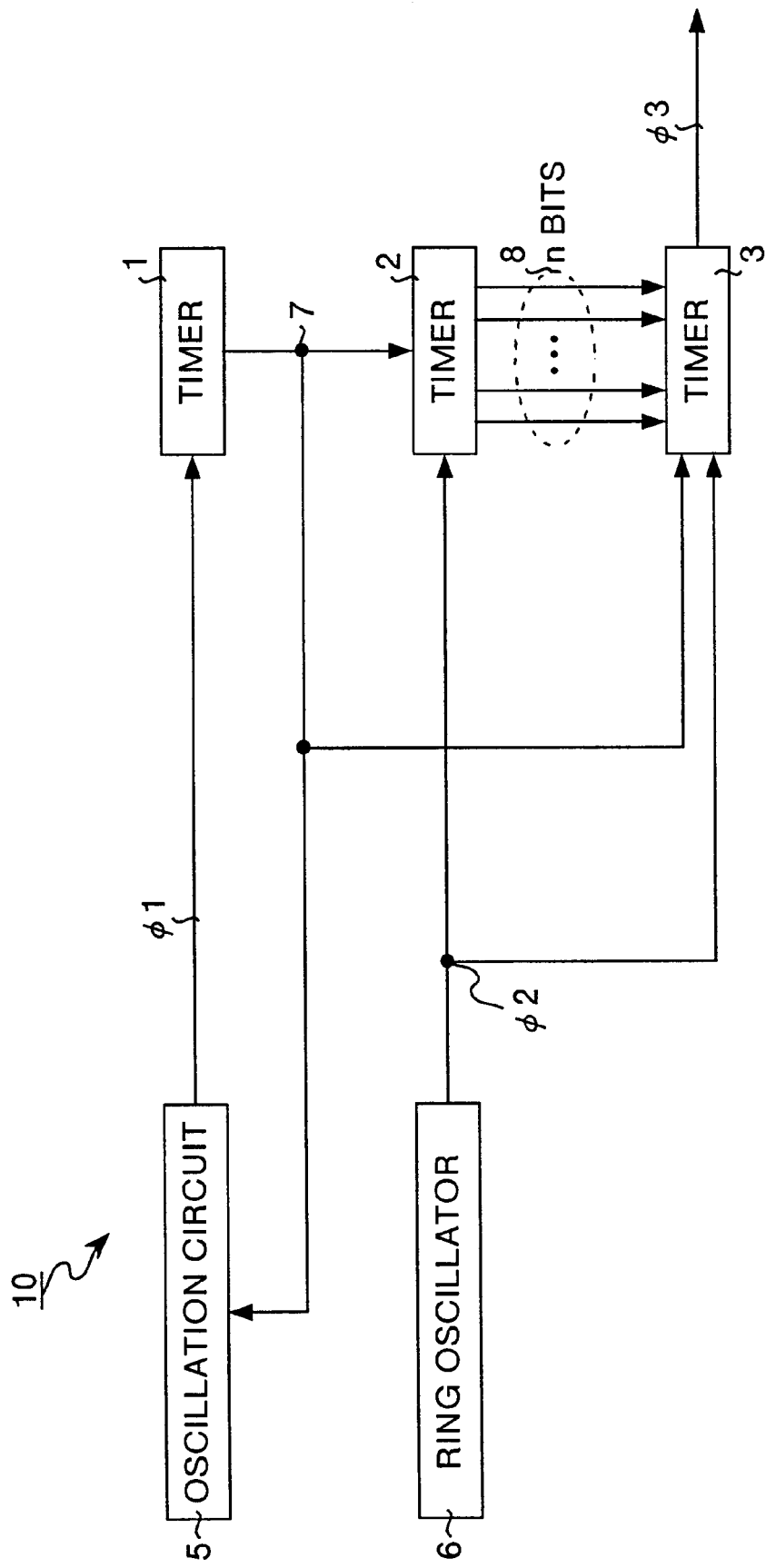
FIG. 1 is a block diagram of a clock generator circuit according to a-first embodiment of the present invention.

FIG. 1 is a block diagram of a clock generator circuit according to a first embodiment. This clock generator circuit 10 comprises an oscillation circuit 5 that is connected with a ceramic oscillator or a crystal oscillator and that generates a clock signal $\phi1$.

The clock generator circuit 10 further includes a timer 1 that counts the clock signal $\phi1$ output from the oscillation circuit 5, a ring oscillator 6 that generates a clock signal $\phi2$, and a timer 2 that counts the clock signal $\phi2$ output from the ring oscillator 6.

The clock generator circuit 10 further includes a timer 3 that has a reload register (not shown) for storing an inverted value of each bit of the timer 2. The timer 3 counts the inverted value, sets this count value, and generates a clock signal $\phi3$.

Reference number 7 denotes an overflow signal of the timer 1. Reference number 8 denotes a signal for setting the count value of the timer 2 to the timer 3.

Figure 2:
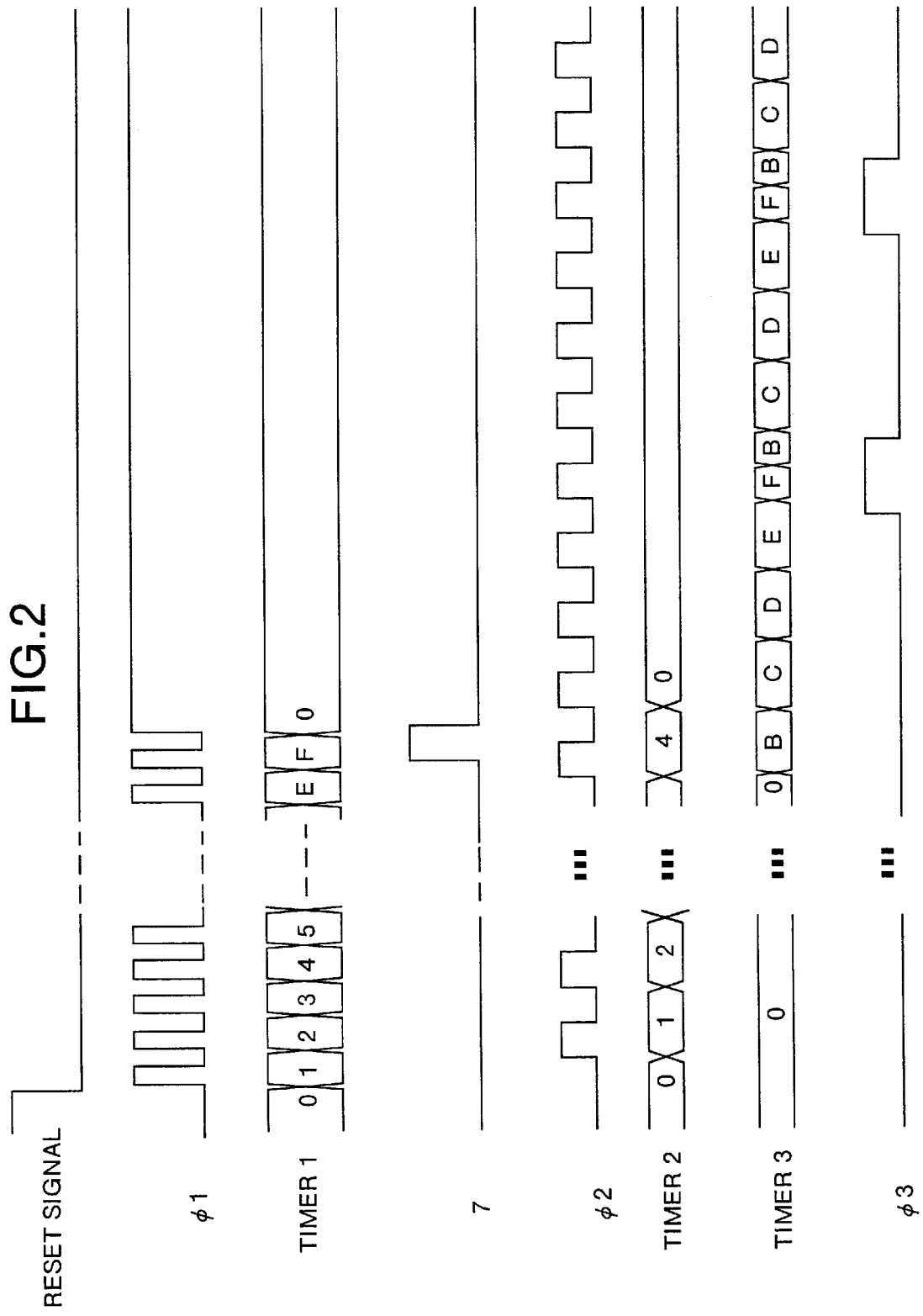
FIG. 2 is a timing chart of the clock generator circuit according to the first embodiment of the present invention.

The clock generator circuit 10 operates as follows. FIG. 2 is a timing chart of the clock generator circuit 10. It is assumed here that the timers 1 to 3 are four-bit timers for convenience of explanation.

After a reset release (the reset signal "H" to "L"), the timer 1 up-counts using the clock signal $\phi1$ as a count source. When the count value of the timer 1 has become "F16", the timer 1 outputs an overflow signal 7.

The timer 2 up-counts, using the ring oscillator 6 as a count source, simultaneously with the timer 1, and sets the count value to the timer 3 and the reload register in synchronism with the rising edge of the overflow signal 7.

In this case, an inverted value is set for each bit. The timer 2 is stopped at the declining edge of the overflow signal 7, and the count value of the timer 2 is initialized to "0". At the same time, the oscillation circuit 5 is stopped.

The timer 3 starts the count operation at the rise of the overflow signal 7, and sets the count value of the timer 2, and then up-counts using the clock signal $\phi2$ as a count source. Each time when the timer 3 overflows, the value of the reload register of the timer 3 is set.

The clock signal $\phi3$ is also used as an internal operation clock.

When the count value of the timer 2 is "416" (01002) at the point of time when the timer 1 overflows, "B16" (10112) is set to the timer 3.

The timer 3 up-counts, and when the count value has become "F16", the timer 3 outputs the clock signal φ3. Then, the value "B16" (10112) of the reload register is set again, and the timer 3 continues the counting.

Thereafter, the clock signal φ3 is output periodically. The period becomes 15 clocks of the clock signal φ1.

According to the first embodiment, in the ring oscillator 6 having a low frequency-precision level, it is possible to obtain a pulse signal having the same frequency-precision level as that of the ceramic oscillator or the crystal oscillator.

Further, as the oscillation circuit 5 is stopped, it is possible to reduce power consumption.

Although each timer of the clock generator circuit 10 has been explained as a four-bit timer, it is possible to use an n-bit timer as it becomes possible to carry out a fine adjustment when the number of bits of the timer is larger.

Further, it is also possible to obtain a clock generator circuit that is strong against changes in the operation environment.

Figure 3:
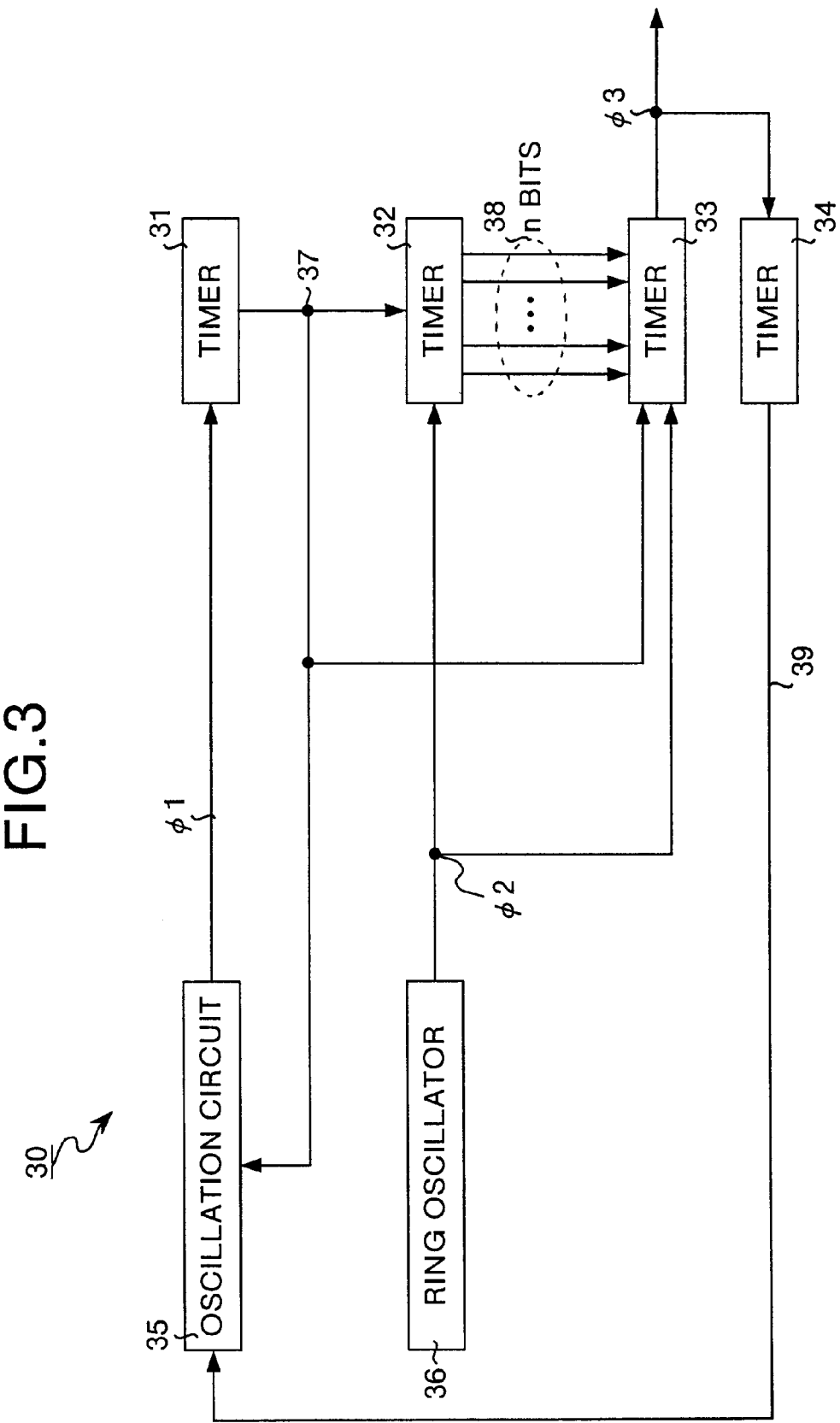
FIG. 3 is a block diagram of a clock generator circuit according to a second embodiment of the present invention.

A clock generator circuit according to a second embodiment is shown in FIG. 3. This clock generator circuit 30 comprises an oscillation circuit 35 that is connected with a ceramic oscillator or a crystal oscillator and that generates a clock signal φ1.

The clock generator circuit 30 further includes a timer 31 that has a reload register (not shown) for counting the clock signal φ1 output from the oscillation circuit 35 and setting this count value.

The clock generator circuit 30 further includes a-ring oscillator 36 that generates a clock signal φ2, and a timer 32 that counts the clock signal φ2 output from the ring oscillator 36.

The clock generator circuit 30 further includes a timer 33 that has a reload register (not shown) for storing an inverted value of each bit of the timer 32. This timer 33 counts this inverted value, sets this count value, and generates a clock signal φ3.

The clock generator circuit 30 further includes a timer 34 that has a reload register (not shown) for counting the clock signal φ3, and setting this count value.

Reference number 37 denotes an overflow signal of the timer 31. Reference number 38 denotes a signal for setting the count value of the timer 32 to the timer 33. Reference number 39 denotes an overflow signal of the timer 34. This overflow signal controls the operation of the oscillation circuit 35.

Figure 4:
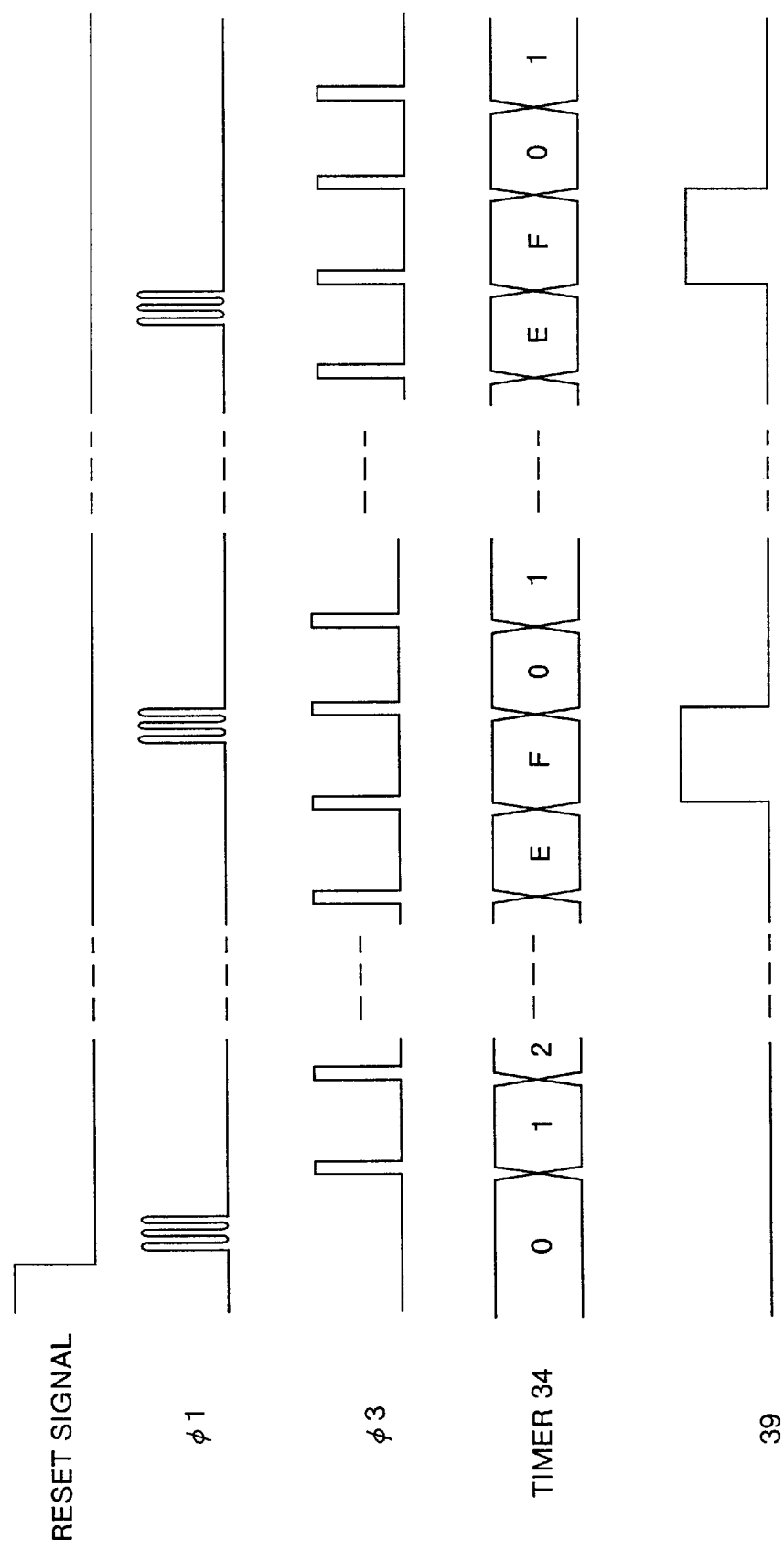
FIG. 4 is a timing chart of the clock generator circuit according to the second embodiment of the present invention.

The clock generator circuit 30 operates as follows. FIG. 4 is a timing chart of the clock generator circuit 30. It is assumed here that the timers 31 to 34 are four-bit timers for convenience of explanation.

After a reset release (the reset signal "H" to "L"), the timer 31 up-counts using the clock signal φ1 as a count source. When the count value of the timer 31 has become "F16", the timer 31 outputs an overflow signal 37.

The timer 32 up-counts using the ring oscillator 36 as a count source in simultaneous with the timer 31, and sets the count value to the timer 33 and the reload register in synchronism with the rising edge of the overflow signal 37.

In this case, an inverted value is set for each bit. The timer 32 is stopped at the declining edge of the overflow signal 37, and the count value of the timer 32 is initialized to "0". At the same time, the oscillation circuit 35 is stopped.

The timer 33 starts the count operation at the rise of the overflow signal 37, and sets the count value of the timer 32, and then up-counts using the clock signal φ2 as a count source. Each time when the timer 33 overflows, the value of the reload register of the timer 33 is set.

The clock signal φ3 is also used as an internal operation clock.

When the count value of the timer 32 is "416" (01002) at the point of time when the timer 31 overflows, "B16" (10112) is set to the timer 33.

The timer 33 up-counts, and when the count value has become "F16", the timer 33 outputs the clock signal φ3. Then, the value "B16" (10112) of the reload register is set again, and the timer 33 continues the counting.

Thereafter, the clock signal φ3 is output periodically. The period becomes 15 clocks of the clock signal φ1.

The timer 34 up-counts using the clock signal φ3 as a count source. When the count value has become "F16", the timer 34 outputs an overflow signal 39, and operates the oscillation circuit 35.

Thereafter, the correction operation is automatically repeated in synchronism with the pulse of the overflow signal 39.

According to the second embodiment, it is possible to alter the period of the correction operation based on a structure of optionally setting the count value of the timer 34 or based on the provision of the reload register. Therefore, it is possible to set a flexible correction period in line with conditions set by the user.

Although each timer of the clock generator circuit 30 has been explained as a four-bit timer, it is possible to use an n-bit timer as it becomes possible to carry out a fine adjustment when the number of bits of the timer is larger.

Further, it is possible to obtain a pulse signal having the same frequency-precision level as that of the ceramic oscillator or the crystal oscillator, in the ring oscillator 36 having a low frequency-precision level.

Further, as the oscillation circuit 35 carries out an intermittent operation, it is possible to reduce power consumption.

Further, based on the automatic correction operation, it is also possible to reduce the load of the software.

Figure 5:
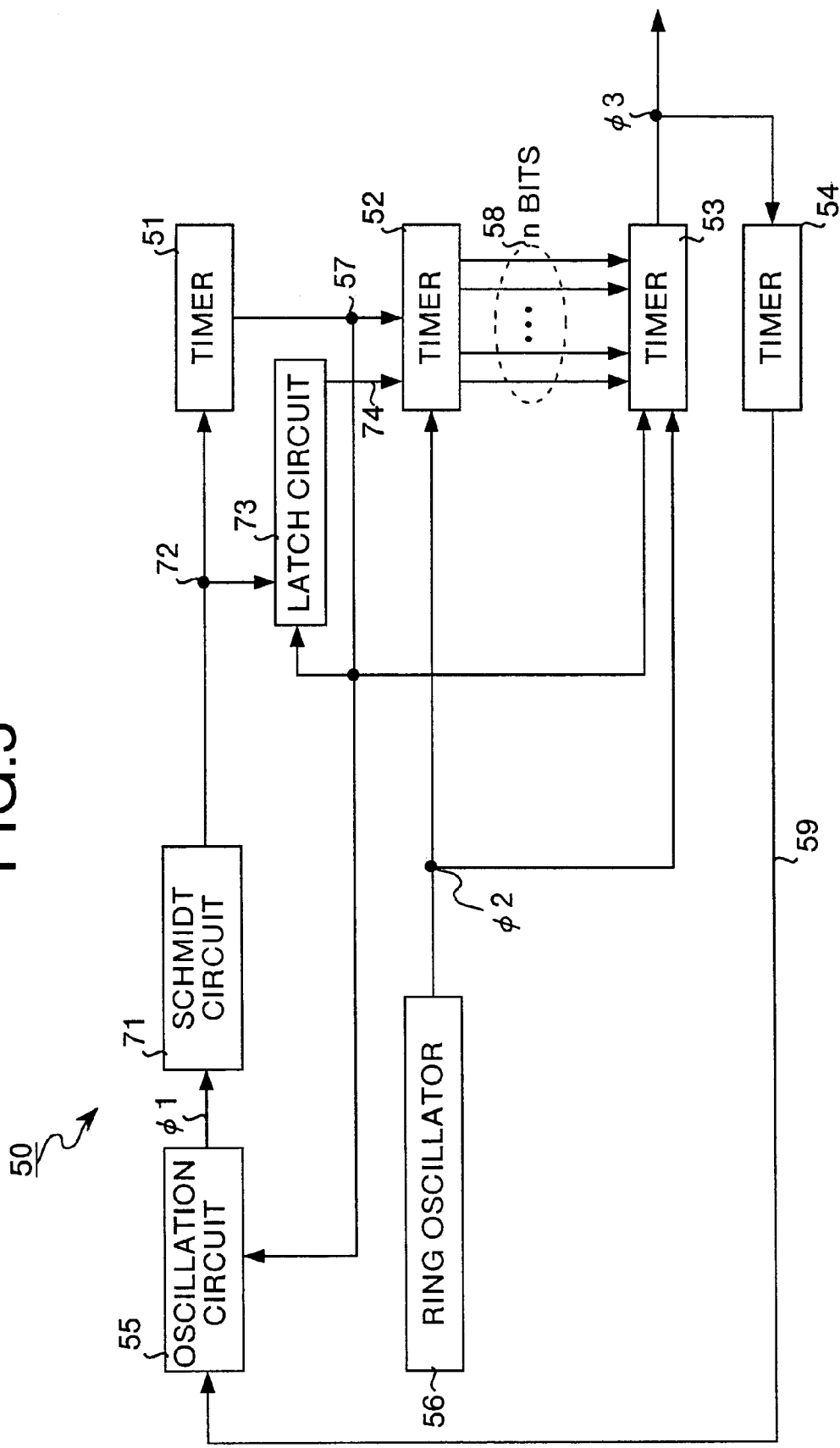
FIG. 5 is a block diagram of a clock generator circuit according to a third embodiment of the present invention.

A clock generator circuit according to a third embodiment is shown in FIG. 5. This clock generator circuit 50 includes an oscillation circuit 55 that is connected with a ceramic oscillator or a crystal oscillator and that generates a clock signal φ1.

The clock generator circuit 50 further includes a Schmidt circuit 71 that is input with a clock signal φ1 output from the oscillation circuit 55, and a timer 51 that has a reload register (not shown) for counting an output signal 72 from the Schmidt circuit 71 and setting this count value.

The clock generator circuit 50 further includes a latch circuit 73 that is input with an overflow signal 57 of the timer 51, a ring oscillator 56 that generates a clock signal φ2, and a timer 52 that inputs the output signal 74 of the latch circuit 73 and counts the clock signal φ2 output from the ring oscillator 56.

The clock generator circuit 50 further includes a timer 53 that has a reload register (not shown) for storing an inverted value of each bit of the timer 52, counting this value, and setting this count value, and that generates a clock signal φ3.

The clock generator circuit 50 further includes a timer 54 that has a reload register (not shown) for counting the clock signal φ3, and setting this count value.

Reference number 58 denotes a signal for setting the count value of the timer 52 to the timer 53. Reference number 59 denotes an overflow signal of the timer 54. This overflow signal controls the operation of the oscillation circuit 55.

Figure 6:
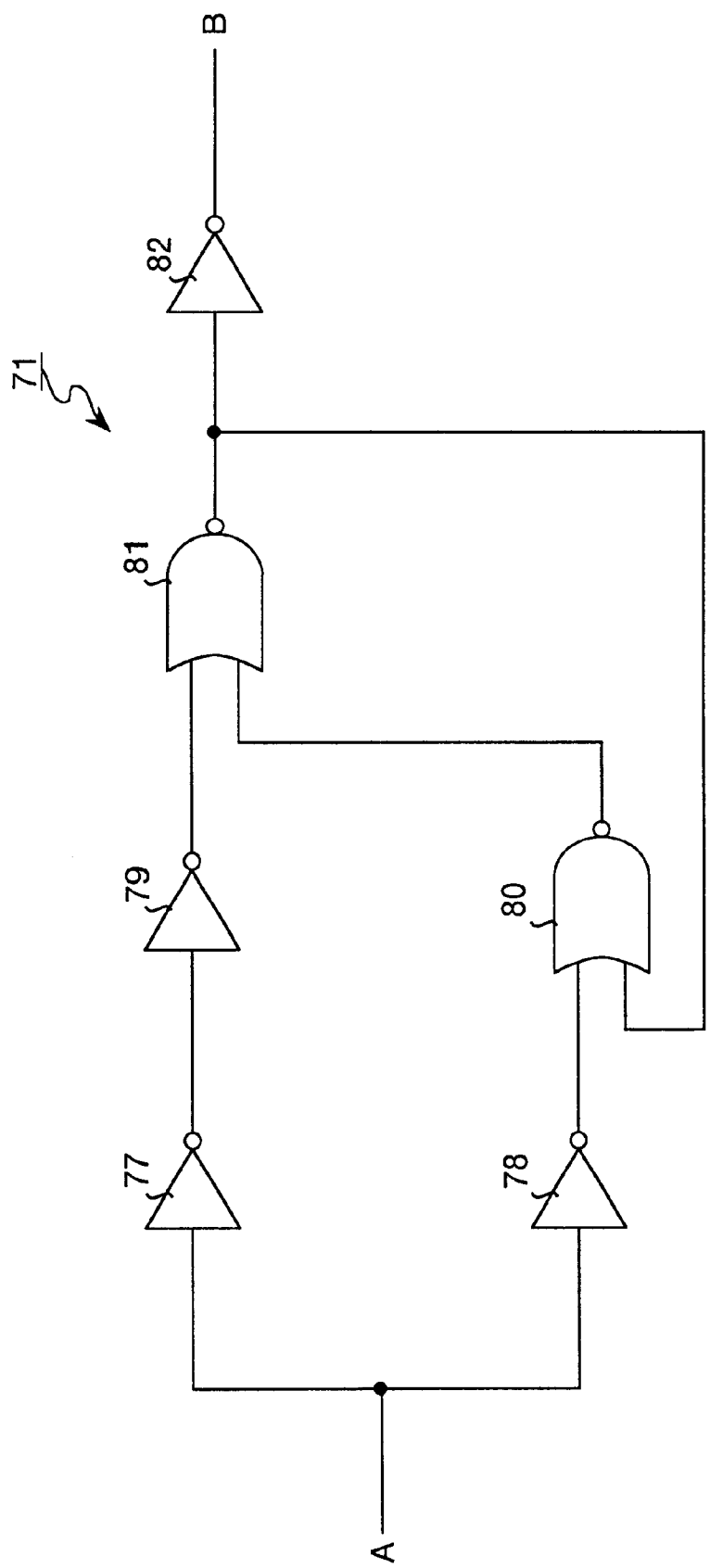
FIG. 6 is a circuit diagram of a Schmidt circuit according to the third embodiment of the present invention.

Detail configuration of the Schmidt circuit 71 is shown in FIG. 6. The Schmidt circuit 71 includes an inverter circuit 77 that has a threshold value of 0.7 Vdd, and an inverter circuit 78 that has a threshold value of 0.3 Vdd.

The Schmidt circuit 71 further includes an inverter circuit 79 that is input with an output from the inverter circuit 77, and an NOR circuit 80 that is input with an output from the inverter circuit 78.

The Schmidt circuit 71 further includes an NOR circuit 81 that is input with outputs from the inverter circuit 79 and the NOR circuit 80 respectively, and an inverter circuit 82 that is input with an output from the NOR circuit 81.

The output of the NOR circuit 81 is also input into the NOR-circuit 80.

When a signal A of a level equal to or below 0.3 Vdd is input, the Schmidt circuit 71 outputs a signal B of "L".

When a signal A of a level equal to or above 0.7 Vdd is input, the Schmidt circuit 71 outputs a signal B of "H".

When a signal A of a level between 0.3 to 0.7 Vdd is input, the signal B has a hysteresis width that the signal B maintains the output of the previous state.

Further, when a signal A as a clock having an amplitude not higher than 0.3 Vdd and not lower than 0.7 Vdd has been input, a signal B as a pulse is output.

It is needless to mention that the threshold values of the inverter circuits 77 and 78 are not limited to 0.7 Vdd or 0.3 Vdd.

The clock generator circuit 50 operates as follows. FIG. 7 is a timing chart of the clock generator circuit 50. In FIG. 7, a clock signal φ1 shows a process from when an oscillation by an overflow signal 59 has been started till when the oscillation has grown.

The clock signal φ1 is input into the Schmidt circuit 71, and when this amplitude has exceeded the hysteresis width (0.3 to 0.7 Vdd) of the Schmidt circuit 71, only the pulse of the output signal 72 is output.

This pulse becomes the count source of the timer 51. Then, the timer 51 starts counting. At the same time, an output signal 72 is input into the latch circuit 73. The latch circuit 73 outputs "H" as an output signal 74 in synchronism with the rising of the output signal 72. The output signal 74 starts the timer 52.

In other words, after it has been confirmed that the oscillation amplitude has become sufficiently large in the Schmidt circuit 71, the timers 51 and 52 start counting, and the correction operation is carried out. Based on this, it is possible to avoid carrying out a correction operation during an unstable period when the oscillation is growing.

Further, the timers 51 to 54 are four-bit timers, for example. After a reset release (the reset signal "H" to "L"), the timer 51 up-counts using the clock signal φ1 as a count source. When the count value of the timer 51 has become "F16", the timer 51 outputs an overflow signal 57.

The timer 52 up-counts using the ring oscillator 56 as a count source in simultaneous with the timer 51, and sets the count value to the timer 53 and the reload register in synchronism with the rising edge of the overflow signal 57.

In this case, an inverted value is set for each bit. The timer 52 is stopped at the declining edge of the overflow signal 57, and the count value of the timer 52 is initialized to "0". At the same time, the oscillation circuit 55 is stopped.

The timer 53 starts the count operation at the rise of the overflow signal 57, and sets the count value of the timer 52, and then up-counts using the clock signal φ2 as a count source. Each time when the timer 53 overflows, the value of the reload register of the timer 53 is set.

The clock signal φ3 is also used as an internal operation clock.

When the count value of the timer 52 is "416" (01002) at the point of time when the timer 51 overflows, "B16" (10112) is set to the timer 53.

The timer 53 up-counts, and when the count value has a become "F16", the timer 53 outputs the clock signal φ3. Then, the value "B16" (10112) of the reload register is set again, and the timer 53 continues the counting.

Thereafter, the clock signal φ3 is output periodically. The period becomes 15 clocks of the clock signal φ1.

The timer 54 up-counts using the clock signal φ3 as a count source. When the count value has become "F16", the timer 54 outputs an overflow signal 59, and operates the oscillation circuit 55.

Thereafter, the correction operation is automatically repeated in synchronism with the pulse of the overflow signal 59.

According to the third embodiment, it is possible to carry out a more stable correction operation by securing a stable oscillation period by the Schmidt circuit 71.

Further, it is possible to alter the period of the correction operation based on a structure of optionally setting the count value of the timer 54 or based on the provision of the reload register. Therefore, it is possible to set a flexible correction period in line with conditions set by the user.

Although each timer of the clock generator circuit 50 has been explained as a four-bit timer, it is possible to use an n-bit timer as it becomes possible to carry out a fine adjustment when the number of bits of the timer is larger.

Further, it is possible to obtain a pulse signal having the same frequency-precision level as that of the ceramic oscillator or the crystal oscillator, in the ring oscillator 56 having a low frequency-precision level.

Further, as the oscillation circuit 55 carries out an intermittent operation, it is possible to reduce power consumption.

Further, based on the automatic correction operation, it is also possible to reduce the load of the software.

As explained above, according to the present invention, there is provided a clock generator circuit that includes an oscillation circuit which generates a first clock signal, a first timer which counts the first clock signal, and a ring oscillator which generates a second clock signal. Furthermore, there is provided a third timer that has a reload register for storing an inverted value of each bit of the second timer, and that generates a third clock signal. This third timer counts the inverted value, and sets the count value in the reload register. Therefore, there is achieved an effect that, in the ring oscillator having a low frequency-precision level, it is possible to obtain a pulse signal having the same frequency-precision level as that of the ceramic oscillator or the crystal oscillator.

Further, as the oscillation circuit is stopped, it is possible to reduce power consumption.

Further, it is also possible to obtain a clock generator circuit that is strong against changes in the operation environment.

Furthermore, the clock generator circuit is provided with a fourth timer that has a reload register for counting the third clock signal and setting the count value, and that outputs an overflow signal for controlling the operation of the oscillation circuit. Therefore, it is possible to alter the period of the correction operation. As a result, there is an effect that it is possible to set a flexible correction period in line with conditions set by the user.

Further, in the ring oscillator having a low frequency-precision level, it is possible to obtain a pulse signal having the same frequency-precision level as that of the ceramic oscillator or the crystal oscillator.

Further, as the oscillation circuit carries out an intermittent operation, it is possible to reduce power consumption.

Further, based on the automatic correction operation, it is also possible to reduce the load of the software.

Furthermore, the clock generator circuit is provided with a Schmidt-circuit that is input with the first clock signal and that outputs a signal to the first timer, and a latch circuit that is input with an output signal of the Schmidt circuit and an overflow signal of the first timer and that outputs a signal to the second timer. Therefore, there is an effect that it is possible to carry out a more stable correction operation by securing a stable oscillation period by the Schmidt circuit.

Further, in the ring oscillator having a low frequency-precision level, it is possible to obtain a pulse signal having the same frequency-precision level as that of the ceramic oscillator or the crystal oscillator.

Further, as the oscillation circuit carries out an intermittent operation, it is possible to reduce power consumption.

Further, based on the automatic correction operation, it is also possible to reduce the load of the software.

Furthermore, is the clock generator circuit, the first timer can set an optional count value. Therefore, it is possible to alter the period up to the time when the first timer overflows. As a result, there is an effect that it is possible to set a flexible correction period in line with conditions set by the user.

Furthermore, in the clock generator circuit, the fourth timer can set an optional count value. Therefore, it is possible to further alter the period of the correction operation. As a result, there is an effect that it is possible to set a flexible correction period in line with conditions set by the user.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A clock generator circuit comprising:
   an oscillation circuit which generates a first clock signal;
   a first timer which counts the first clock signal;
   a ring oscillator which generates a second clock signal;
   a second timer that receives an overflow signal of the first timer, and that counts the second clock signal; and
   a third timer including a reload register for storing an inverted value of each bit of the second timer, counting the inverted value, and setting a count value of the second timer, the third timer generating a third clock signal.

2. The clock generator circuit according to claim 1, further comprising a fourth timer including a second reload register for counting the third clock signal and setting a count value of the third timer, the fourth timer outputting an overflow signal for controlling operation of the oscillation circuit.

3. The clock generator circuit according to claim 2, further comprising:
   a Schmidt circuit providing an input to the first clock signal and outputting a signal to the first timer; and
   a latch circuit receiving an output signal of the Schmidt circuit and an overflow signal of the first timer and outputting a signal to the second timer.

4. The clock generator circuit according to claim 1, wherein the first timer sets an optional count value.

5. The clock generator circuit according to claim 2, wherein the fourth timer sets an optional count value.

6. The clock generator circuit according to claim 2, wherein the first timer sets an optional count value.

7. The clock generator circuit according to claim 3, wherein the first timer sets an optional count value.

8. The clock generator circuit according to claim 3, wherein the fourth timer sets an optional count value.

* * * * *

UNITED STATES PATENT AND TRADEMARK OFFICE
CERTIFICATE OF CORRECTION

PATENT NO.    : 6,353,351 B1
DATED         : March 5, 2002
INVENTOR(S)   : Minoru Aikawa It is certified that error appears in the above-identified patent and that said Letters Patent is hereby corrected as shown below:

<u>Title page,</u>
Item [73], Assignee, should read as follows:
-- [73]   Assignee:    Mitsubishi Denki Kabushiki Kaisha, Tokyo (JP) and Mitsubishi Electric System LSI Design Corporation, Hyogo (JP) --

Signed and Sealed this

Twelfth Day of November, 2002

*Attest:*

*Attesting Officer*

JAMES E. ROGAN
*Director of the United States Patent and Trademark Office*